(12) United States Patent
Igarashi et al.

(10) Patent No.: US 11,878,329 B2
(45) Date of Patent: Jan. 23, 2024

(54) METHOD FOR CLEANING SILICON WAFER

(71) Applicant: SHIN-ETSU HANDOTAI CO., LTD., Tokyo (JP)

(72) Inventors: Kensaku Igarashi, Nishigo-mura (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 153 days.

(21) Appl. No.: 16/637,012

(22) PCT Filed: Jul. 31, 2018

(86) PCT No.: PCT/JP2018/028519
§ 371 (c)(1),
(2) Date: Feb. 6, 2020

(87) PCT Pub. No.: WO2019/035345
PCT Pub. Date: Feb. 21, 2019

(65) Prior Publication Data
US 2020/0164410 A1 May 28, 2020

(30) Foreign Application Priority Data
Aug. 18, 2017 (JP) ................................. 2017-158174

(51) Int. Cl.
*B08B 3/08* (2006.01)
*H01L 21/02* (2006.01)

(52) U.S. Cl.
CPC .......... *B08B 3/08* (2013.01); *H01L 21/02052* (2013.01); *B08B 2203/005* (2013.01)

(58) Field of Classification Search
None
See application file for complete search history.

(56) References Cited

U.S. PATENT DOCUMENTS

2005/0271985 A1 12/2005 Miya et al.
2006/0011214 A1 1/2006 Liu et al.
(Continued)

FOREIGN PATENT DOCUMENTS

JP 2001-060576 A 3/2001
JP 2006-073945 A 3/2006
(Continued)

OTHER PUBLICATIONS

Dec. 24, 2021 Office Action issued in Taiwanese Patent Application No. 107127330.
(Continued)

*Primary Examiner* — Nicole Blan
(74) *Attorney, Agent, or Firm* — Oliff PLC

(57) ABSTRACT

A method for cleaning a silicon wafer includes the steps of: supplying hydrofluoric acid onto a surface of the silicon wafer to treat the silicon wafer while rotating at a first rotational rate, stopping the supply of the hydrofluoric acid and shaking off hydrofluoric acid on the surface of the silicon wafer without supplying pure water onto the surface of the silicon wafer while rotating the silicon wafer at a second rotational rate which is the same as or faster than the first rotational rate, and supplying ozone water onto the surface of the silicon wafer to treat the silicon wafer after shaking the hydrofluoric acid off the surface while rotating at a third rotational rate which is faster than the second rotational rate. This method for cleaning a silicon wafer is capable of suppressing adhesion of water marks and particles and enhancing the wafer quality.

1 Claim, 4 Drawing Sheets

(56) References Cited

U.S. PATENT DOCUMENTS

| | | | |
|---|---|---|---|
| 2009/0275213 A1 | 11/2009 | Gotou et al. | |
| 2011/0308549 A1* | 12/2011 | Minami | H01L 21/67028 |
| | | | 134/26 |
| 2011/0308554 A1 | 12/2011 | Namba | |
| 2012/0074101 A1 | 3/2012 | Nakamura | |
| 2013/0233344 A1 | 9/2013 | Kabasawa et al. | |

FOREIGN PATENT DOCUMENTS

| | | |
|---|---|---|
| JP | 2009-272411 A | 11/2009 |
| JP | 2012-004450 A | 1/2012 |
| JP | 2012-074475 A | 4/2012 |
| JP | 2012-129409 A | 7/2012 |
| JP | 2013-123001 A | 6/2013 |
| KR | 10-2011-0137728 A | 12/2011 |

OTHER PUBLICATIONS

Sep. 4, 2018 International Search Report issued in International Patent Application No. PCT/JP2018/028519.
Apr. 10, 2019 Office Action issued in Japanese Patent Application No. 2017-158174.
Feb. 18, 2020 International Preliminary Report on Patentability issued in International Patent Application No. PCT/JP2018/028519.
Jan. 17, 2023 Office Action issued in Korean Patent Application No. 2020-7004456.
Jul. 13, 2023 Decision of Refusal issued in Korean Patent Application No. 2020-7004456.
Mar. 10, 2023 Office Action issued in Chinese Patent Application No. 201880052419.8.

* cited by examiner

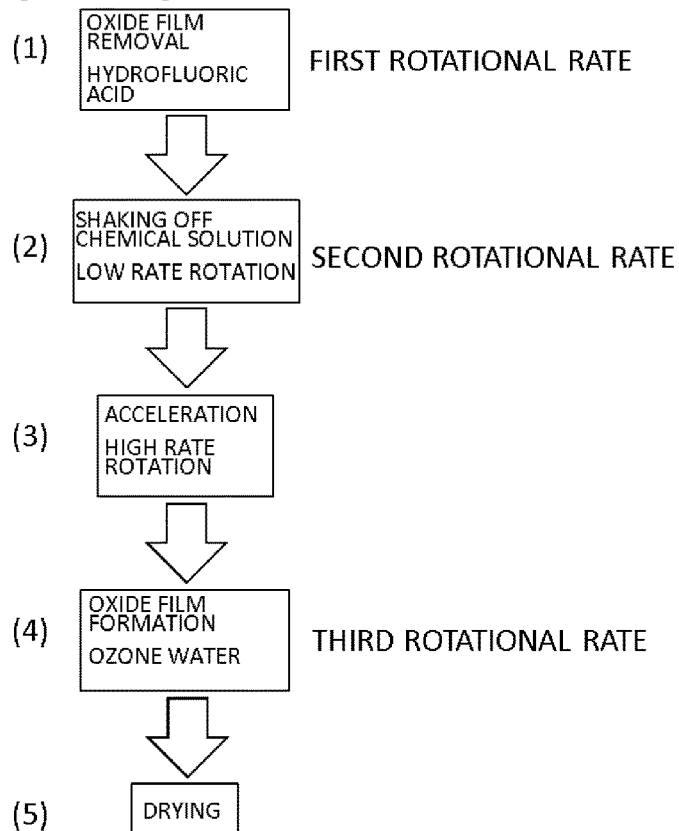
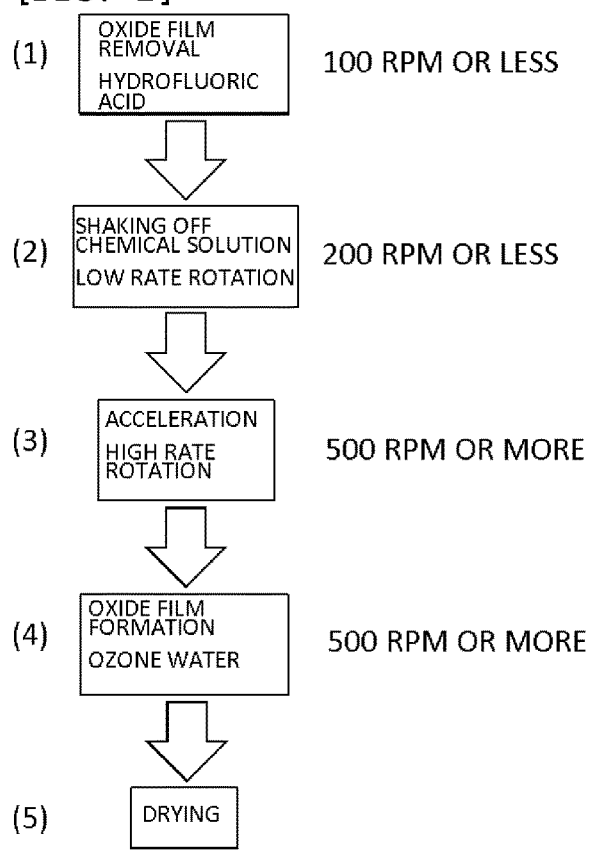

[FIG. 3]
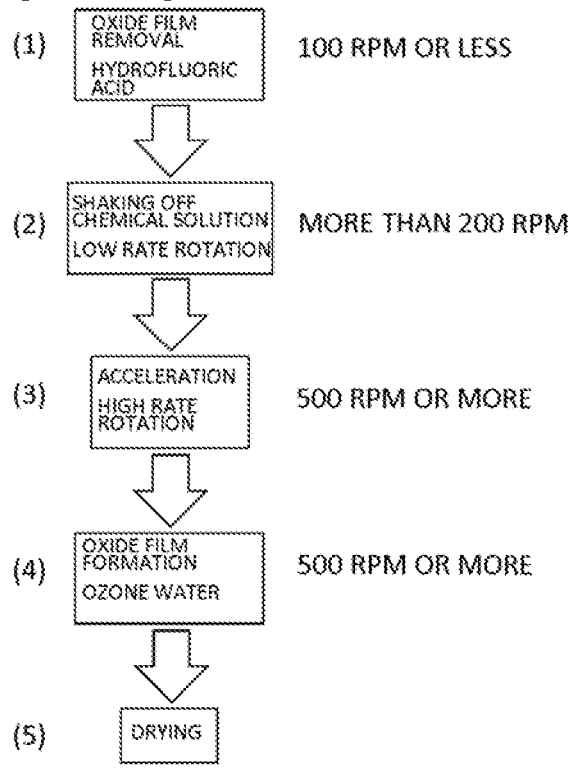
[FIG. 4]
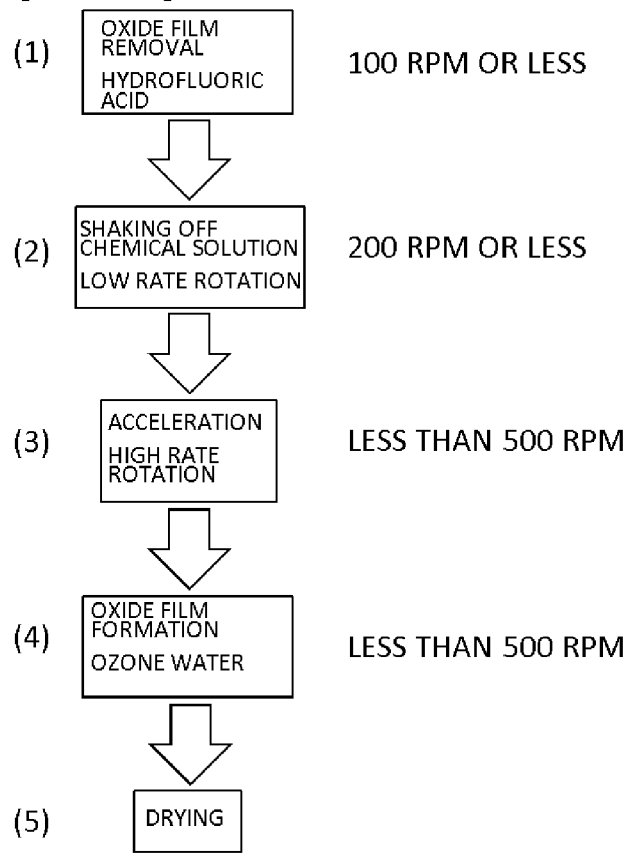

[FIG. 5]
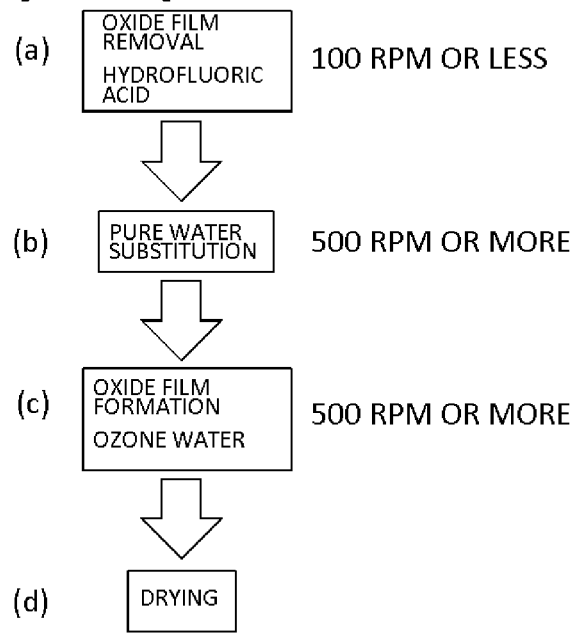
[FIG. 6]
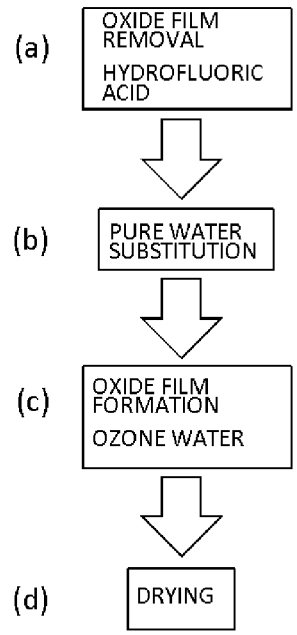

[FIG. 7]
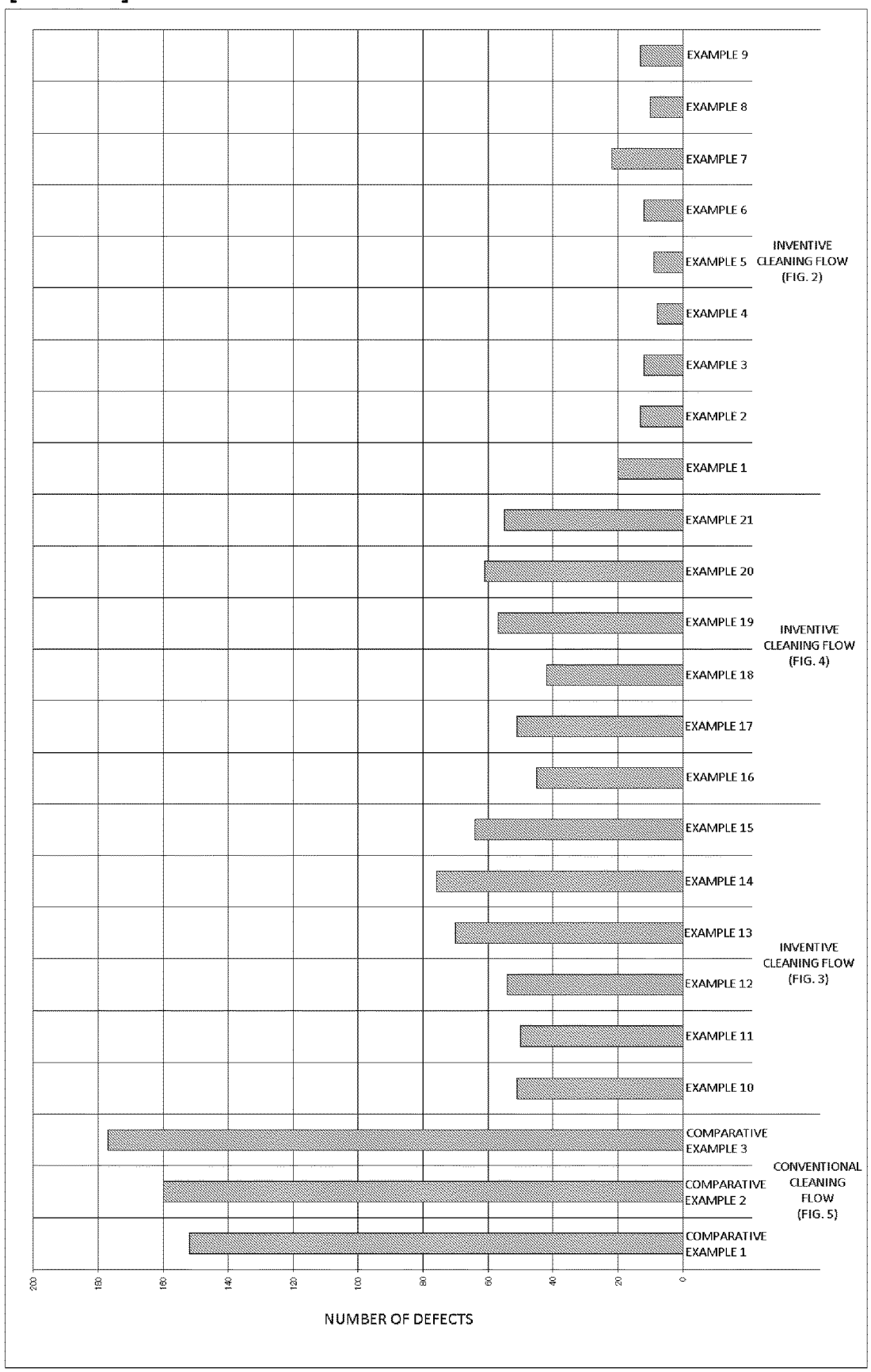

METHOD FOR CLEANING SILICON WAFER

TECHNICAL FIELD

The present invention relates to a method for cleaning a silicon wafer.

BACKGROUND ART

In a water-repelling surface treatment for a silicon wafer (semiconductor silicon wafer) by using a single-wafer-processing spin cleaning machine, an oxide film formed on the surface of a semiconductor wafer is generally removed with a cleaning liquid such as hydrofluoric acid (HF) from the semiconductor wafer (Patent Document 1, Patent Document 2).

It has been conventional to perform an oxide film removal treatment with HF (hydrofluoric acid) at a low rate, perform a reoxidation treatment by performing a rinse treatment (pure water or ozone water) while raising a rotational rate, and shift to a high rate rotation at the time of drying. A flow diagram of a conventional method for cleaning a silicon wafer is shown in FIG. 6. Firstly, as shown in FIG. 6(a), the oxide film present on the surface of a silicon wafer is removed with hydrofluoric acid. Next, as shown in FIG. 6(b), hydrofluoric acid is substituted with pure water. Next, as shown in FIG. 6(c), cleaning is performed with ozone water, and an oxide film is formed. Next, as shown in FIG. 6(d), drying is performed.

CITATION LIST

Patent Literature

Patent Document 1: Japanese Unexamined Patent Application Publication No. 2009-272411
Patent Document 2: Japanese Unexamined Patent Application Publication No. 2001-060576

SUMMARY OF INVENTION

Technical Problem

However, under conditions of conventional art, particles such as water marks are generated in a rinse treatment, a difference occurs in the formation rate of an oxide film on a wafer surface in a step of forming an oxide film with ozone water, and particles adhere to portions where hydrophilization is delayed due to oxidation being slow, thereby degrading the quality of the wafer surface.

The problems of conventional art are, more specifically, as follows. In the above-described conventional treatment process using a single-wafer-processing spin cleaning machine, after a step of removing the oxide film with HF (FIG. 6(a)), water marks are generated in a pure water treatment (treatment of substituting with pure water) of FIG. 6(b). In addition, at the time of the ozone water treatment (FIG. 6(c)), the difference in the formation rate of the oxide film on the wafer surface occurs since rotational rate is low, and particles and the like adhere to parts where hydrophilization is delayed, thereby significantly degrading the wafer quality.

The present invention has been made in view of the above-described problem, and an object of the present invention is to provide a method for cleaning a silicon wafer capable of suppressing adhesion of water marks and particles that are generated in a conventional cleaning method and enhancing the wafer quality.

Solution to Problem

To achieve the object, the present invention provides a method for cleaning a silicon wafer, comprising, in the following order, the steps of: supplying hydrofluoric acid onto a surface of the silicon wafer to treat the silicon wafer while rotating at a first rotational rate, stopping the supply of the hydrofluoric acid and shaking off hydrofluoric acid present on the surface of the silicon wafer without supplying pure water onto the surface of the silicon wafer while rotating the silicon wafer at a second rotational rate which is the same as or faster than the first rotational rate, and supplying ozone water onto the surface of the silicon wafer to treat the silicon wafer after shaking the hydrofluoric acid off the surface while rotating at a third rotational rate which is faster than the second rotational rate.

With such a method for cleaning a silicon wafer, it is possible to remove the oxide film while preventing generation of water marks and preventing adhesion of particles and the like that are generated when removing the oxide film with hydrofluoric acid.

In this case, the first rotational rate is preferably 100 rpm or less, the second rotational rate is preferably 200 rpm or less, and the third rotational rate is preferably 500 rpm or more.

By setting each rotational rate to such a range, it is possible to suppress generation of water marks and adhesion of particles more effectively.

Advantageous Effects of Invention

With the inventive method for cleaning a silicon wafer, it is possible to remove the oxide film while preventing generation of water marks and preventing adhesion of particles and the like that are generated when removing the oxide film with hydrofluoric acid and clean the silicon wafer.

BRIEF DESCRIPTION OF DRAWINGS

FIG. 1 is a flow diagram showing the inventive method for cleaning a silicon wafer.
FIG. 2 is a flow diagram showing the conditions of the method for cleaning a silicon wafer in Examples 1 to 9.
FIG. 3 is a flow diagram showing the conditions of the method for cleaning a silicon wafer in Examples 10 to 15.
FIG. 4 is a flow diagram showing the conditions of the method for cleaning a silicon wafer in Examples 16 to 21.
FIG. 5 is a flow diagram showing the conditions of the method for cleaning a silicon wafer in Comparative Examples 1 to 3.
FIG. 6 is a flow diagram showing a conventional method for cleaning a silicon wafer.
FIG. 7 is a graph showing the results of the Examples and Comparative Examples.

DESCRIPTION OF EMBODIMENTS

Hereinafter, the present invention will be described in detail as an example of an embodiment with reference to the drawings, but the present invention is not limited thereto.

The present invention is a method for cleaning a silicon wafer, and firstly, hydrofluoric acid is supplied onto a surface of the silicon wafer to treat the silicon wafer while rotating at a first rotational rate. Next, the supply of the hydrofluoric acid is stopped and hydrofluoric acid present on the surface of the silicon wafer is shaken off without supplying pure water onto the surface of the silicon wafer while rotating the silicon wafer at a second rotational rate which is the same as or faster than the first rotational rate. Next, ozone water is supplied onto the surface of the silicon wafer to treat the silicon wafer after shaking the hydrofluoric acid off the surface while rotating at a third rotational rate which is faster than the second rotational rate. The inventive method for cleaning a silicon wafer includes the above steps in the order described.

The inventive method for cleaning a silicon wafer will be described more specifically with reference to FIG. 1. FIG. 1 is a flow diagram showing the inventive method for cleaning a silicon wafer.

A known spin cleaning machine can be used in the inventive method for cleaning a silicon wafer. In the inventive method for cleaning a silicon wafer, firstly, as shown in FIG. 1(1), hydrofluoric acid is supplied onto a surface of the silicon wafer to treat the silicon wafer while rotating at a first rotational rate (step 1). An oxide film (natural oxide film) formed on the surface of the silicon wafer is completely removed by this step 1. The first rotational rate is preferably under a condition of low rate rotation of 100 rpm or less. In this way, particles on the wafer surface are removed and metallic contamination and the like is removed.

Next, as shown in FIG. 1(2), the supply of the hydrofluoric acid is stopped and hydrofluoric acid present on the surface of the silicon wafer is shaken off without supplying pure water onto the surface of the silicon wafer while rotating the silicon wafer at a second rotational rate (step 2). Here, the second rotational rate is the same as or faster than the first rotational rate. The second rotational rate is preferably a low rate rotation (medium rate rotation) of 200 rpm or less. An important point of the present invention is not to use pure water on a wafer whose wafer surface has become a hydrophobic surface due to the oxide film being removed by the hydrofluoric acid treatment. In this way, formation of water marks on the wafer surface is prevented. Note that the lower limit of the low rotation rate is 50 rpm due to apparatus restriction.

Next, as shown in FIG. 1(3), it is preferable to have a step of raising the rotational rate (step 3). This is for raising the rotational rate to the rotational rate (third rotational rate) of the ozone water treatment (step 4) described below.

Next, as shown in FIG. 1(4), ozone water is supplied onto the surface of the silicon wafer to treat the silicon wafer while rotating at a third rotational rate, the hydrofluoric acid having been shaken off the surface (step 4). The third rotational rate is faster than the second rotational rate. In this step 4, reoxidation treatment of the silicon wafer surface is performed by the action of the ozone water. The third rotational rate is preferably 500 rpm or more. It is considered that the higher the high rotation rate (third rotational rate) at the time of the acceleration step (step 3) and the ozone water treatment step (step 4), the better, but approximately 1500 rpm is substantially the upper limit due to apparatus restriction.

After performing the ozone water treatment, next, as shown in FIG. 1(5), the silicon wafer can be dried (step 5). The drying step can be performed by stopping the ozone water supply and continuing the rotation of the silicon wafer. The rotational rate is not particularly limited but it is preferably the same as or faster than the third rotational rate.

By the above method which has the steps shown in FIG. 1, it is possible to eliminate generation of water marks and clean the silicon wafer without adhesion of particles and the like that are generated when the oxide film is removed with hydrofluoric acid.

The functions and effects of each of the inventive steps are as follows. In the hydrofluoric acid treatment of step 1, by removing the oxide film at a low rate rotation (preferably 100 rpm or less), it is possible to remove particles while suppressing generation of water marks and the like. If a rinse treatment by pure water or ozone water is performed subsequently at the same rotational rate as is conventional, water marks are generated. Accordingly, in the present invention, in order to prevent water marks and re-adhesion of particles due to the rinse treatment, after shaking off the hydrofluoric acid chemical solution at a low rate rotation (medium rate rotation, preferably 200 rpm or less) without supplying pure water after removing the oxide film with hydrofluoric acid in step 2, the step of increasing the rotational rate (preferably accelerating to 500 rpm or more) (step 3) is performed, and the reoxidation treatment (step 4) is performed with ozone water after acceleration (preferably 500 rpm or more). If pure water is used in the rinse treatment, water marks are generated, and therefore, pure water rinsing is not used in the present invention. Therefore, in the present invention, pure water rinsing is not performed (pure water substitution is not performed) before shaking off the hydrofluoric acid after removing the oxide film with hydrofluoric acid, and naturally, pure water rinsing is not performed after shaking off the hydrofluoric acid either. In addition, increasing the rotational rate in step 3 and supplying the ozone water in step 4 described above may be performed simultaneously.

By removing the oxide film completely under a low rate condition of 100 rpm or less in the hydrofluoric acid treatment, the adhesion of particles on the wafer surface is improved. In the present invention, further, after subsequently shaking off the HF on the wafer at a low rate rotation (medium rate rotation, preferably 200 rpm or less), the rotation is accelerated to a high rate rotation (preferably 500 rpm or more) and the ozone water treatment is performed at the high rate rotation.

EXAMPLE

Hereinafter, the present invention will be described more specifically with reference to Examples and Comparative Examples, but the present invention is not limited to these Examples.

Examples 1 to 9

A silicon wafer was cleaned in accordance with the inventive flow diagram shown in FIG. 1. The rotational rates of the silicon wafer in steps 1 to 4 were set so as to satisfy the range of rotational rates shown in FIG. 2. That is, a step of removing an oxide film (step 1) was performed at a low rate rotation of 100 rpm or less, and after a step of shaking off a chemical solution at a rotational rate of 200 rpm or less (step 2) was performed, the process proceeded to an acceleration step (step 3) with a high rate rotation of 500 rpm or more, a step of forming an oxide film with ozone water (step 4) was performed at a high rate rotation of 500 rpm or more, and subsequently, drying (step 5) was performed.

The chemical solution used was hydrofluoric acid and ozone water, and pure water was not used. Note that the concentration of the hydrofluoric acid in step 1 was set to 1.0 mass %, the hydrofluoric acid treatment duration was set to 30 seconds, and the rotational rate at this time was set to 50 rpm. In addition, the concentration of the ozone water in step 4 was set to 20 ppm by mass. The ozone water treatment duration in step 4 was set to 60 seconds. The drying in step 5 was performed at 1000 rpm for 60 seconds.

In Example 1, the first rotational rate was set to 50 rpm, the second rotational rate to 50 rpm, and the third rotational rate to 500 rpm. In Examples 2 to 9, the second rotational rate (the rotational rate at which the chemical solution is shaken off) and the third rotational rate (the rotational rate at the time of the acceleration process and the oxide film formation) were set as shown in Table 1.

The number of defects on the silicon wafer after the cleaning and drying were finished was counted and shown in Table 1. For counting the number of defects on the silicon wafer, SP5 manufactured by KLA-Tencor Corporation was used.

TABLE 1

| | Rotational rate at which chemical solution was shaken off (second rotational rate) (r.p.m.) | Acceleration process (third rotational rate) (r.p.m.) | Rotational rate at the time of oxide film formation (third rotational rate) (r.p.m.) | Number of defects |
|---|---|---|---|---|
| Example 1 | 50 | 500 | 500 | 20 |
| Example 2 | 50 | 1000 | 1000 | 13 |
| Example 3 | 50 | 1500 | 1500 | 12 |
| Example 4 | 100 | 500 | 500 | 8 |
| Example 5 | 100 | 1000 | 1000 | 9 |
| Example 6 | 100 | 1500 | 1500 | 12 |
| Example 7 | 200 | 500 | 500 | 22 |
| Example 8 | 200 | 1000 | 1000 | 10 |
| Example 9 | 200 | 1500 | 1500 | 13 |

In Examples 1 to 9 in which the cleaning flow of FIG. 2 was used, adhesion of particles onto the wafer surface was considerably improved by, after shaking off the chemical solution at 200 rpm or less without performing pure water rinsing after removing the oxide film with hydrofluoric acid, shifting to a high rate rotation of 500 rpm or more and then performing the oxide film formation treatment with ozone water.

Comparative Examples 1 to 3

A silicon wafer was cleaned in accordance with the conventional cleaning flow shown in FIG. 6. The rotational rate in each step was set so as to be within the range shown in FIG. 5. In this conventional cleaning flow, oxide film removal was performed at a low rate rotation of 100 rpm or less with hydrofluoric acid (FIG. 5(a)) and a rinse treatment was performed with pure water and ozone water while shifting to a high rate rotation (500 rpm or more) (FIGS. 5(b) and (c)). Subsequently, drying (FIG. 5(d)) was performed.

In Comparative Examples 1 to 3, the chemical solution used was hydrofluoric acid, pure water, and ozone water. Note that the concentration of the hydrofluoric acid was set to 1.0 mass %, the hydrofluoric acid treatment duration was set to 30 seconds, and the rotational rate in the hydrofluoric acid treatment was set to 50 rpm, the same as in Examples 1 to 9. In addition, the concentration of the ozone water was set to 20 ppm by mass, and the ozone water treatment duration was set to 60 seconds, the same as in Examples 1 to 9. The drying was also performed at 1000 rpm for 60 seconds, the same as in Examples 1 to 9.

The rotational rate at which the chemical solution was shaken off, the rotational rate at the time of the pure water substitution, and the rotational rate at the time of the oxide film formation in Comparative Examples 1 to 3 were set as shown in Table 2. Since the pure water substitution was performed while performing the acceleration process, the maximum rate in the acceleration process is the same as the maximum rotational rate at the time of the pure water substitution.

As in Examples 1 to 9, the number of defects on the silicon wafer after the cleaning and drying were finished was counted and shown in Table 2. For counting the number of defects on the silicon wafer, SP5 manufactured by KLA-Tencor Corporation was used.

TABLE 2

| | Rotational rate at which chemical solution was shaken off (r.p.m.) | Acceleration process (r.p.m.) | Rotational rate at the time of the pure water substitution (r.p.m.) | Rotational rate at the time of oxide film formation (r.p.m.) | Number of defects |
|---|---|---|---|---|---|
| Comparative Example 1 | 200 | 500 | 500 | 500 | 152 |
| Comparative Example 2 | 200 | 1000 | 1000 | 1000 | 160 |
| Comparative Example 3 | 200 | 1500 | 1500 | 1500 | 177 |

It can be seen from Table 2 that in Comparative Examples 1 to 3, there are many defects on the wafer surface. This is because, in the conventional method, there is considerable adhesion of water marks and particles due to the rinse treatment with pure water and ozone water being performed while shifting to the high rate rotation (500 rpm or more).

Examples 10 to 15

A silicon wafer was cleaned in accordance with the inventive flow diagram shown in FIG. 1. Note that the rotational rates of the silicon wafer in steps 1 to 4 were set so as to satisfy the range of rotational rates shown in FIG. 3. Except that the rotational rate in step 2 (the second rotational rate) has a different range, the other conditions are the same as in Examples 1 to 9. That is, the oxide film removal step (step 1) was performed at a low rate rotation of 100 rpm or less, but the step of shaking off the chemical solution (step 2) was performed at a rate faster than 200 rpm as the second rotational rate, which is different from Examples 1 to 9. Subsequently, as in Examples 1 to 9, the process proceeded to an acceleration step (step 3) with a high rate rotation of 500 rpm or more, a step of forming an oxide film (step 4) was performed at a high rate rotation of 500 rpm or more with ozone water, and subsequently, drying (step 5) was performed. In Examples 10 to 15, the second rotational rate (the rotational rate at which the chemical solution is shaken off) and the third rotational rate (the rotational rate at the time of the acceleration process and the oxide film formation) were set as shown in Table 3.

The number of defects on the silicon wafer after the cleaning and drying were finished was counted as in Examples 1 to 9 and shown in Table 3.

TABLE 3

| | Rotational rate at which chemical solution was shaken off (second rotational rate) (r.p.m.) | Acceleration process (third rotational rate) (r.p.m.) | Rotational rate at the time of oxide film formation (third rotational rate) (r.p.m.) | Number of defects |
|---|---|---|---|---|
| Example 10 | 300 | 500 | 500 | 51 |
| Example 11 | 300 | 1000 | 1000 | 50 |
| Example 12 | 300 | 1500 | 1500 | 54 |
| Example 13 | 400 | 500 | 500 | 70 |
| Example 14 | 800 | 1000 | 1000 | 76 |
| Example 15 | 1200 | 1500 | 1500 | 64 |

As seen from Table 3, when the process of shaking off the chemical solution is made faster than 200 rpm, the number of defects increases, but there are fewer defects compared to the conventional method (Comparative Examples 1 to 3).

Examples 16 to 21

A silicon wafer was cleaned in accordance with the inventive flow diagram shown in FIG. 1. Note that the rotational rates of the silicon wafer in steps 1 to 4 were set so as to satisfy the range of rotational rates shown in FIG. 4. Except that the rotational rates in step 3 and step 4 have a different range, the other conditions are the same as in Examples 1 to 9. That is, the oxide film removal step (step 1) was performed at a low rate rotation of 100 rpm or less and the step of shaking off the chemical solution (step 2) was performed at a rotational rate of 200 rpm or less. Subsequently, unlike in Examples 1 to 9, the process proceeded to an acceleration step (step 3) with a rotational rate of less than 500 rpm, a step of forming an oxide film with ozone water (step 4) was performed at a rotational rate of less than 500 rpm, and subsequently, drying (step 5) was performed. In Examples 16 to 21, the second rotational rate (the rotational rate at which the chemical solution is shaken off) and the third rotational rate (the rotational rate at the time of the acceleration process and the oxide film formation) were set as shown in Table 4.

The number of defects on the silicon wafer after the cleaning and drying were finished was counted as in Examples 1 to 9 and shown in Table 4.

TABLE 4

| | Rotational rate at which chemical solution was shaken off (second rotational rate) (r.p.m.) | Acceleration process (r.p.m.) | Rotational rate at the time of oxide film formation (third rotational rate) (r.p.m.) | Number of defects |
|---|---|---|---|---|
| Example 16 | 50 | 50 | 200 | 45 |
| Example 17 | 50 | 100 | 300 | 51 |
| Example 18 | 50 | 400 | 400 | 42 |
| Example 19 | 200 | 50 | 250 | 57 |
| Example 20 | 200 | 100 | 300 | 61 |
| Example 21 | 200 | 400 | 400 | 55 |

As seen from Table 4, in Examples 16 to 21, the number of defects increased compared to Examples 1 to 9. This is because, if the acceleration and the ozone water treatment after shaking off the chemical solution are performed at less than 500 rpm, the oxide film formation rate becomes uneven and particles adhere to parts where oxidation with ozone water is delayed. However, in Examples 16 to 21, the number of defects decreased compared to Comparative Examples 1 to 3. When the acceleration process is slower than the process of shaking off the chemical solution, an acceleration process is not performed and the rate is lowered, and therefore, the oxide film formation with ozone water is performed starting at a rate lower than the rotational rate at the time of the oxide film formation, thereby causing unevenness in the oxide film formation rate due to insufficient rotational rate, which causes particle adhesion.

FIG. 7 shows a graph which summarizes the number of defects in Examples 1 to 21 and Comparative Examples 1 to 3. As seen from FIG. 7, the number of defects is small in Examples 1 to 21 compared to Comparative Examples 1 to 3, which means the advantage of the present invention has been gained. In particular, the number of defects is remarkably small in Examples 1 to 9. As described, after delaminating the oxide film with hydrofluoric acid, the process of shaking off the hydrofluoric acid was performed at a low rate (medium rate) of 200 rpm or less without discharging a chemical solution such as rinse, and subsequently, the rate was accelerated to 500 rpm or more and then the oxide film formation treatment was performed with ozone water, and in this way, the best effect was obtained.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for cleaning a silicon wafer, comprising, in the following order, the steps of:
    supplying hydrofluoric acid onto a surface of the silicon wafer to treat the silicon wafer while rotating at a first rotational rate, thereby removing an oxide film of the surface of the silicon wafer and making the surface a hydrophobic surface,
    stopping the supply of the hydrofluoric acid and shaking off hydrofluoric acid present on the hydrophobic surface of the silicon wafer from which the oxide film has been removed without supplying pure water onto the hydrophobic surface of the silicon wafer while rotating the silicon wafer at a second rotational rate which is the same as or faster than the first rotational rate, and
    supplying ozone water onto the hydrophobic surface of the silicon wafer from which the oxide film has been removed to treat the silicon wafer after shaking the hydrofluoric acid off the surface while rotating at a third rotational rate which is faster than the second rotational rate, thereby performing reoxidation to the surface of the silicon wafer, wherein
    the first rotational rate is 100 rpm or less,
    the second rotational rate is 200 rpm or less, and
    the third rotational rate is 500 rpm or more.

* * * * *